United States Patent
Mekis et al.

(10) Patent No.: US 12,353,007 B2
(45) Date of Patent: Jul. 8, 2025

(54) OPTICAL WAFER-SCALE PHOTODIODE BANDWIDTH MEASUREMENT SYSTEM

(71) Applicant: Cisco Technology, Inc., San Jose, CA (US)

(72) Inventors: Attila Mekis, Carlsbad, CA (US); Gianlorenzo Masini, Carlsbad, CA (US)

(73) Assignee: Cisco Technology, Inc., San Jose, CA (US)

( * ) Notice: Subject to any disclaimer, the term of this patent is extended or adjusted under 35 U.S.C. 154(b) by 354 days.

(21) Appl. No.: 18/156,280

(22) Filed: Jan. 18, 2023

(65) Prior Publication Data

US 2024/0241309 A1    Jul. 18, 2024

(51) Int. Cl.
  G02B 6/12    (2006.01)
  G01R 31/317    (2006.01)
  G02B 6/42    (2006.01)
  G02F 1/225    (2006.01)

(52) U.S. Cl.
  CPC ... G02B 6/12019 (2013.01); G01R 31/31728 (2013.01); G02B 6/4266 (2013.01); G02F 1/2257 (2013.01)

(58) Field of Classification Search
  CPC .............. G02B 6/12019; G02B 6/4266; G01R 31/31728; G02F 1/2257
  See application file for complete search history.

(56) References Cited

U.S. PATENT DOCUMENTS

| | | |
|---|---|---|
| 4,749,277 A | 6/1988 | Eichen et al. |
| 11,073,737 B2 | 7/2021 | Masini et al. |
| 2003/0072005 A1 | 4/2003 | Tsao et al. |
| 2003/0099425 A1* | 5/2003 | Grubb ............... H04B 10/25 359/344 |
| 2018/0031415 A1* | 2/2018 | Haitjema ............. G01J 1/02 |
| 2022/0107229 A1* | 4/2022 | Barnard ............. G01K 11/00 |
| 2022/0370010 A1* | 11/2022 | Zilkie ............ G02B 6/12004 |

FOREIGN PATENT DOCUMENTS

CN    109813459 A    5/2019

OTHER PUBLICATIONS

Ang Miao et al., "Wideband Calibration of Photodetector Frequency Response Based on Optical Heterodyne Measurement," Wiley Online Library, Dated Nov. 13, 2008 [Abstract Only].

(Continued)

*Primary Examiner* — Tina Wong
(74) *Attorney, Agent, or Firm* — Patterson + Sheridan, LLP (57) ABSTRACT

Embodiments herein described an optical system for testing the bandwidth of a photodiode (PD) in a photonic integrated circuit (PIC). In one embodiment, a first optical signal is provided to bias one or more PDs in the PIC which generate a DC bias (e.g., DC voltage) across the PD whose bandwidth is being tested. A second optical signal is directed to the PD being tested, thereby generating an AC signal. The second optical signal can be a tunable optical signal where its frequency/wavelength is varied to test the bandwidth of the PD. The AC signal generated by the PD being tested is passed through a heating element (e.g., a resistor) which generates heat. This heat is then measured by an interferometer. The output of the interferometer can be correlated to a bandwidth of the PD.

20 Claims, 4 Drawing Sheets

(56) References Cited

OTHER PUBLICATIONS

Shijun Xia et al., "Simple Method For Frequency Response Measurement of Photodetectors Based on Wavelength-To-Time Mapping," Optica Publishing Group, Dated Oct. 11, 2021, pp. 1-8.
Alexander Cole, Eric Gustafson, "Automated Photodiode Frequency Response Measurement System," LIGO, Dated Sep. 27, 2013, pp. 1-13.

* cited by examiner

OPTICAL WAFER-SCALE PHOTODIODE BANDWIDTH MEASUREMENT SYSTEM

TECHNICAL FIELD

Embodiments presented in this disclosure generally relate to using optical signals to test a bandwidth of a photodiode in a photonic integrated circuit.

BACKGROUND

As the speed of optical links increases, measurement of high-speed transceiver components, such as modulators and photodiodes (PDs), becomes more challenging. Many optical transceivers are based on photonic integrated circuits (PICs), which contain waveguide photodiodes. At lower speeds, sorting the PICs based on the bandwidth of the PD may not be necessary, but detector performance may become a yield limiter as data rates reach 100 GBaud/s. Currently, measuring waveguide PD performance at high speeds requires expensive RF equipment and time-consuming calibration, which often precludes its inclusion in production die sort, and thus can result in yield loss later down the manufacturing line. A simple and cost-effective method to measure the photodetector bandwidth at the wafer level is needed.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate typical embodiments and are therefore not to be considered limiting; other equally effective embodiments are contemplated.

To facilitate understanding, identical reference numerals have been used, where possible, to designate identical elements that are common to the figures. It is contemplated that elements disclosed in one embodiment may be beneficially used in other embodiments without specific recitation.

DESCRIPTION OF EXAMPLE EMBODIMENTS

Overview

One embodiment presented in this disclosure is a photonic chip that includes a first optical interface for receiving a first optical signal, a first PD configured to generate a DC bias using the first optical signal, a second PD that is biased by the DC bias generated by the first photodiode, a second optical interface configured to receive a tunable optical signal for testing a bandwidth of the second PD where the second PD generates a varying AC signal based on the tunable optical signal, a resistor where the varying AC signal heats the resistor, an interferometer thermally coupled to the resistor, a third optical interface for receiving a third optical signal that passes through the interferometer, and a fourth optical interface coupled to an output of the interferometer, wherein an optical output of the interferometer changes in response to heat generated by the resistor.

Another embodiment presented in this disclosure is a photonic chip that includes a first PD configured to be biased by a DC bias generated by a DC biasing element, a first optical interface for receiving a combined optical signal formed by combining two optical signals at different frequencies where the first PD generates an AC signal using the combined optical signal, a heating element where the AC signal causes the heating element to emit heat, an interferometer thermally coupled to the heating element, a second optical interface for receiving a first optical signal that passes through the interferometer, and a third optical interface coupled to an output of the interferometer where an output of the interferometer changes in response to the heat generated by the heating element.

Another embodiment presented in this disclosure is a method that includes applying a DC bias to a first PD in a photonic chip, receiving a first amplitude-modulated optical signal with a varying carrier frequency to test a bandwidth of the first PD, generating, using the first PD, an AC signal based on the first optical signal, applying the AC signal to a heating element thermally coupled to an interferometer in the photonic chip, and determining the bandwidth of the first PD based on an optical output of the interferometer.

Example Embodiments

Embodiments herein described an optical system for testing the bandwidth of a photodiode (PD) in a photonic integrated circuit (PIC). In one embodiment, the optical system is an all-optical system where only optical signals are input into, and received from, the PIC. In one embodiment, a first optical signal is provided to biasing PDs in the PIC which generate a DC bias (e.g., DC voltage) across the PD whose bandwidth is being tested (e.g., a device under test (DUT)). A second optical signal is received and directed to the PD being tested which causes this PD to generate an AC signal. The second optical signal can be a varying optical signal where its frequency/wavelength is varied to test the bandwidth of the PD. In one embodiment, the second optical signal is generated by combining two optical signals with different wavelengths (e.g., optical heterodyning). Adjusting the difference between the wavelengths of the two optical signals allows to vary the frequency of the AC signal generated by the PD being tested.

The PIC can include a heat source (e.g., a resistor) that receives the AC signal. The amplitude of the AC signal determines the amount of heat generated by the resistor. For example, if the second optical signal is currently at a wavelength for which the AC signal frequency is within the bandwidth of the PD being tested, then the resulting AC signal has a higher amplitude (or more power) thereby causing the heat source to generate more heat. However, as the second optical signal is tuned to a wavelength such that the frequency of the AC signal is outside the bandwidth of the PD being tested, then the resulting AC signal has a lower amplitude (or less power) thereby causing the heat source to generate less heat.

In one embodiment, the heat source is thermally coupled to an interferometer, or more specifically, to one of the arms of the interferometer. The PIC can receive an optical signal that passes through the interferometer (which can be a balanced or imbalanced interferometer) and is then output at another optical interface of the PIC. The heat from the heat source affects the output of the interferometer. As such, the output of the interferometer can be detected and then correlated to the AC signal generated by the PD being tested which can then indicate the bandwidth of the PD.

The embodiments herein provide an all-optical solution to testing a bandwidth of a PD in a PIC, but are not limited to such. For example, the PD being tested may be biased using a DC voltage provided by probes rather than using an optical signal to generate a DC bias using one or more DC biasing PDs. However, an advantage of an all-optical testing system is that it avoids the increased cost and complexity that results from having both electrical and optical connectivity in the testing system.

Figure 1:
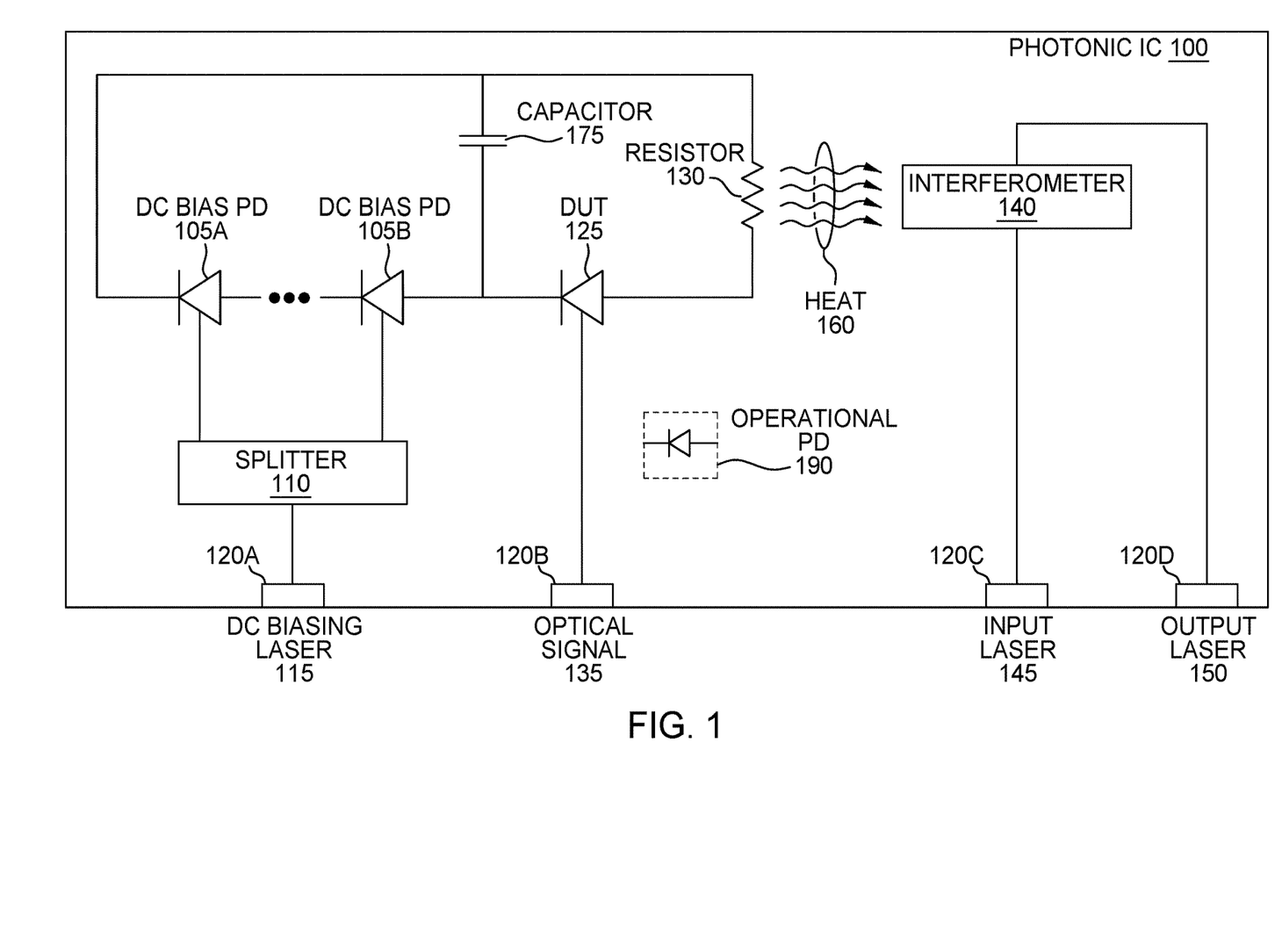
FIG. 1 illustrates using optical signals to test a bandwidth of a PD in a PIC, according to one embodiment described herein.

FIG. 1 illustrates using optical signals to test a bandwidth of a PD DUT 125 in a PIC 100, according to one embodiment described herein. The PIC 100 can be formed using any type of semiconductor or combination of semiconductors (e.g., silicon, germanium, III-V semiconductors, etc.). The PIC 100 may also be referred to as a photonic chip.

Although not shown, the PIC 100 may include many different optical components or devices such as modulators, optical amplifiers, optical transmitters, optical receivers, and the like. In one embodiment, the PIC 100 is used in a high-speed application where, e.g., data rates reach 100 GBaud/s or more. In this example, the PIC 100 includes an operational PD 190 that is used in the high-speed application. However, before shipping the PIC 100 or before activating the high-speed application, the manufacture (or the customer) may want to ensure the operational PD 190 has sufficient bandwidth for the high-speed application. For example, PD 190 and PD 125 may share a limited bandwidth due to statistical variations of the wafer processing.

However, it is difficult to directly test an operational PD 190 that is used during the operation of the PIC 100. Instead of testing the operational PD 190, the optical system in FIG. 1 tests a proxy PD—i.e., the PD DUT 125. The PD DUT 125 may be fabricated using the same fabrication steps as the operational PD 190. Or the PD DUT 125 may be in the same process corner as the operational PD 190. Thus, any performance aspect that arise in the PD DUT 125 will also be in the operational PD 190. Stated differently, the PD DUT 125 will likely have the same bandwidth as the operational PD 190. As such, if the manufacturer or customer can confirm that the PD DUT 125 has a sufficient bandwidth for the high-speed application, it is very likely the operational PD 190 does as well.

To test the PD DUT 125, the PIC 100 includes a series of DC biasing PDs 105A, 105B which are daisy chained. While multiple PDs 105 are shown, one DC biasing PD 105 may be sufficient to generate a DC bias (e.g., a DC voltage and current) for the PD DUT 125.

To power the DC biasing PDs 105, the PIC 100 includes a first optical interface 120A which receives a DC biasing laser 115. In one embodiment, the DC biasing laser 115, which is typically held at a fixed wavelength (although it could vary), is introduced into the PIC 100 via the optical interface 120A and then transmitted to an optical splitter 110 where the laser signal is split and transmitted to each of the DC biasing PDs 105. While FIG. 1 illustrates splitting a single laser 115 to power the DC biasing PDs 105, in another embodiment the PIC 100 could include a separate optical interface for receiving respective lasers for powering each of the PDs 105.

The embodiments herein are not limited to any particular optical interface 120 for receiving the external laser signals or for transmitting optical signals (as is the case for the optical interface 120D). For example, the optical interfaces 120 may be grating couplers which are disposed on the top or bottom surface of the PIC 100, or could be butt couplers that are disposed on the sides of the PIC 100. Further, lenses could be used to focus the laser signals before they enter the PIC 100 or after an optical signal exits the PIC 100. In one embodiment, the laser signals are received from optical fibers that are aligned to the optical interfaces 120.

The optical interface 120B couples an amplitude-modulated optical signal 135 to the PD DUT 125 which, in response, generates an AC signal. The carrier frequency of the optical signal 135 changes in order to determine the bandwidth of the PD DUT 125, which is a proxy for the bandwidth of the operational PD 190. As will be discussed in more detail in FIG. 2, the amplitude-modulated optical signal 135 may be generated by combining two separate optical signals that have two different wavelengths/frequencies (e.g., optical heterodyning). However, the optical system in FIG. 1 could also be used with a single amplitude-modulated optical source that can directly output the optical signal 135, although performing optical heterodyning may reduce costs and simplify the control process.

As the carrier frequency of the optical signal 135 changes, so does the AC signal generated by the PD DUT 125. Thus, the optical signal 135 can raster through frequencies that test the limits of the bandwidth of the PD DUT 125. As the carrier frequency of the optical signal 135 increases, eventually it begins to exceed the bandwidth of the PD DUT 125 and the amplitude of the AC signal begins to drop. This drop in the AC signal can be detected using a resistor 130 and the interferometer 140 as discussed in more detail below.

The PIC 100 includes a capacitor 175 that serves as a bypass electrical path for the AC signal generated by the PD DUT 125. The capacitor 175 also serves as a stabilizer (low pass filter) for the bias voltage generated by 105. As shown, one end of the capacitor 175 is coupled at a first node between the PD DUT 125 and the plurality of DC biasing PDs 105.

The AC signal generated by the PD DUT 125 flows through the resistor 130 which dissipates heat in relationship to the amplitude (or the power) of the AC signal. That is, the larger the amplitude of the AC signal, the greater amount of heat generated by the resistor 130. As already mentioned above, the amplitude of the AC signal is also correlated to the bandwidth of the PD DUT 125. Thus, detecting the heat emitted by the resistor 130 can indicate the bandwidth of the PD DUT 125. Put differently, the heat generated in the resistor 130 is correlated to the bandwidth of the PD DUT 125.

The resistor 130 is just one example of a suitable heat source. Other types of circuit elements besides a resistor 130 can be used as heating elements to generate heat that corresponds to the amplitude of the AC signal and bandwidth of the PD DUT 125.

As shown in FIG. 1, the heat 160 generated by the resistor 130 is received by the interferometer 140. That is, the resistor 130 is thermally coupled to the interferometer. The interferometer 140 can be a balanced interferometer (as discussed in FIG. 2) or an imbalanced interferometer (as discussed in FIG. 3). In one embodiment, the interferometer is a Mach-Zehnder Interferometer (MZI). However, the embodiments herein can be used with any type of interferometer that can be used as a temperature sensor.

The PIC 100 includes a third optical interface 120C that receives an input laser 145 that is transmitted through the interferometer. As discussed in more detail below, the heat 160 from the resistor 130 affects the light from the input laser 145 as it travels through the interferometer 140. The output of the interferometer 140 is transmitted from the PIC 100 using the optical interface 120D. This output laser 150 can be detected and measured to determine the bandwidth of the PD DUT 125. That is, as the carrier frequency of the optical signal 135 changes, the output laser 150 can be measured to then determine the bandwidth of the PD DUT 125.

Figure 2:
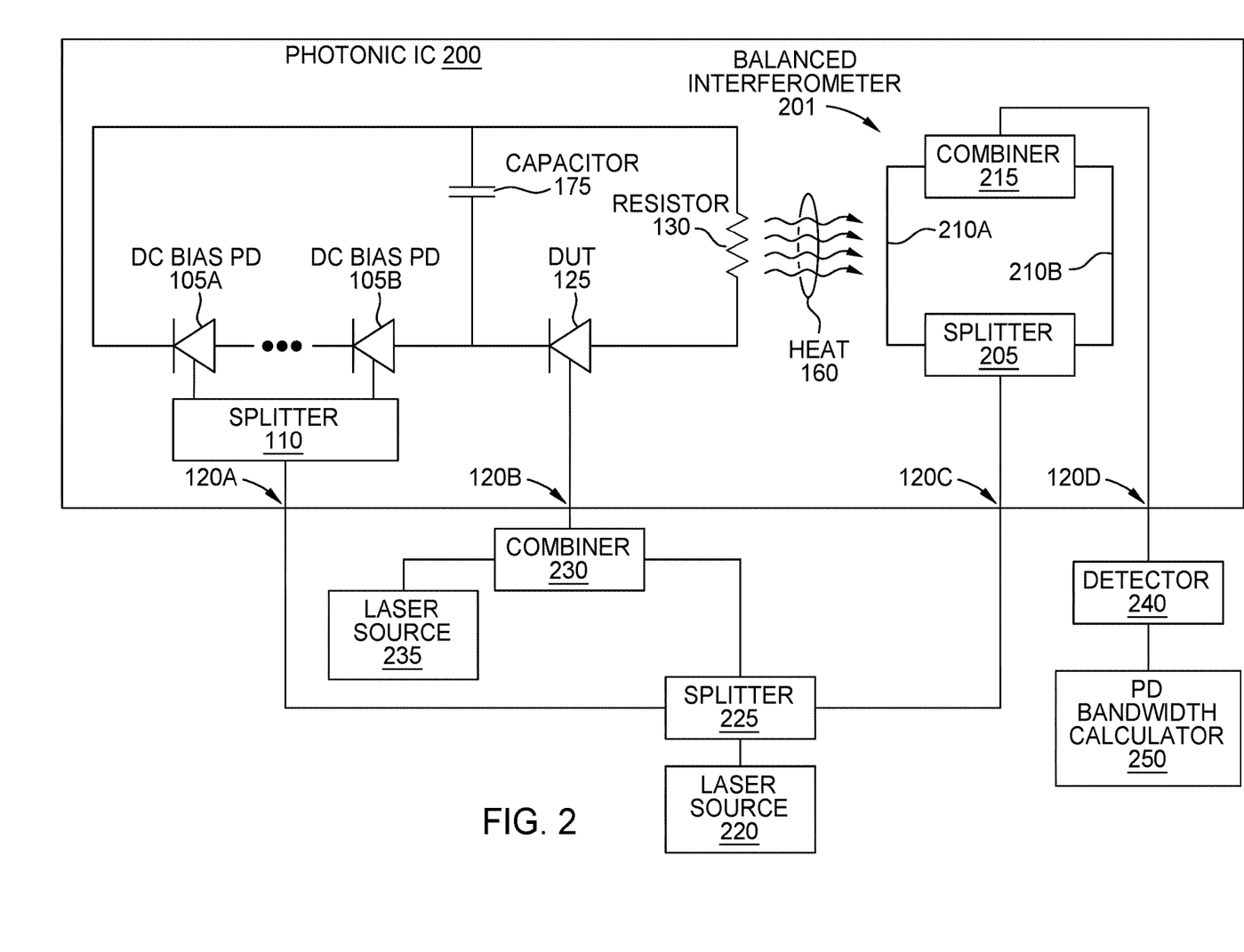
FIG. 2 illustrates using optical signals to test a bandwidth of a PD in a PIC using a balanced interferometer, according to one embodiment described herein.

FIG. 2 illustrates using optical signals to test a bandwidth of the PD DUT 125 in a PIC 200 using a balanced interferometer 201, according to one embodiment described herein. The PIC 200 has many of the same components and elements as the PIC 100 in FIG. 1 as indicated by using the same reference numbers.

The PIC 200 includes the balanced interferometer 201 which receives the optical signal from the optical interface 120C which is then split by an optical splitter 205 into two waveguides 210A and 210B (also referred to as arms, or waveguide arms). In a balanced interferometer 201, the lengths of the waveguides 210 are the same, thus, when the optical signals in the arms are recombined by the combiner 215, the resulting optical signal is essentially the same as the optical signal that was input into the interferometer 201, assuming the arms did not apply phase shifts to the respective optical signals.

However, the heat 160 alters the optical properties of the waveguide 210A which can create a phase offset between the optical signal propagating through the waveguide 210A relative to the optical signal propagating through the waveguide 210B. That is, the heat 160 selectively heats the waveguide 210A so that the waveguide 210A is more affected by the heat 160 than the waveguide 210B. This can be done by placing the waveguide 210A closer to the resistor 130 in the PIC 200 or by providing a thermally conductive path between the waveguide 210A and the resistor 130 (e.g., a metal trace that is proximate to both elements).

The phase offset between the optical signals in the waveguides 210A and 210B result in the optical signal output from the interferometer 201 being different from the optical signal input into the interferometer 201. For example, the phase offset between the optical signals in the waveguides 210A and 210B can result in destructive interference which can reduce the amplitude (or power) in the output signal output by the combiner 215.

A detector 240 can receive the output signal and convert it into an electrical signal. A PD bandwidth calculator 250 (e.g., a software application executing on a computing system having a processor and memory) can then correlate the electrical signal to a bandwidth of the PD DUT 125. For example, if the AC signal generated by heterodyne in PD DUT 125 is within its bandwidth, then the AC signal generates more heat 160 which creates a greater phase offset in the interferometer 201, thereby resulting in an output optical signal with different power. As the laser received at the PD DUT 125 is tuned to a wavelength such that the AC signal resulting from the heterodyne is outside the bandwidth of the PD DUT 125, the resulting AC signal generates less heat 160 which creates a smaller phase offset between the optical signals in the arms of the interferometer 201, thereby resulting in an output optical signal with greater power. The PD bandwidth calculator 250 can then correlate the power of the output signal of the interferometer 201 to a bandwidth limit (or limits) of the PD DUT 125.

In addition to illustrating the balanced interferometer 201, FIG. 2 also illustrates external laser sources and components that can be used to introduce the laser signals into the PIC 200. In this example, there are two laser sources which can be used to power the DC biasing PDs 105 and provide a tunable laser to the PD DUT 125.

A laser source 220 can output a fixed wavelength laser (e.g., a continuous wave (CW) laser) that is then split by a splitter 225 into three optical signals. One of the three split optical signals is received at the optical interface 120A and is in turn split by the splitter 110 into optical signals for powering the PDs 105. A second one of the three split optical signals is received at the optical interface 120C and is used as the input of the balanced interferometer 201. The third one of the split optical signals is received at a combiner 230 where it is combined with a laser signal generated by the laser source 235.

In contrast to the laser source 220, the laser source 235 may be a tunable laser source which can generate a laser with different wavelengths. As such, the wavelength/frequency ($\lambda_1$) of the optical signal generated by the laser source 235 is different from the wavelength/frequency ($\lambda_2$) of the optical signal generated by the laser source 220. In one embodiment, the two light frequencies are similar enough that their difference or beat frequency (i.e., $\lambda_1 - \lambda_2$) is in the radio or microwave band. In this case, the wavelength of the signal generated by the laser source 235 can be set so that the beat frequency of the two optical signals can be in the desired AC signal range of the PD DUT 125. That way, when performing optical heterodyning, the tunable laser signal output by the combiner 230 can test whether the PD DUT 125 can detect a beat frequency that corresponds to the high-speed application.

One advantage of the optical setup in FIG. 2 is that only two laser sources are used. Further, only one of the laser sources is tunable while the other does not have to be. However, in other embodiments, both the laser sources 235 and the laser source 220 may be tunable. Having two tunable lasers may provide faster response time or increase the range of the possible beat frequencies. Further, it may be preferred to use separate laser sources to power the PDs 105 or to provide the input to the interferometer 201 (rather than using only the laser source 220 as shown) since these sources could be less powerful lasers.

Figure 3:
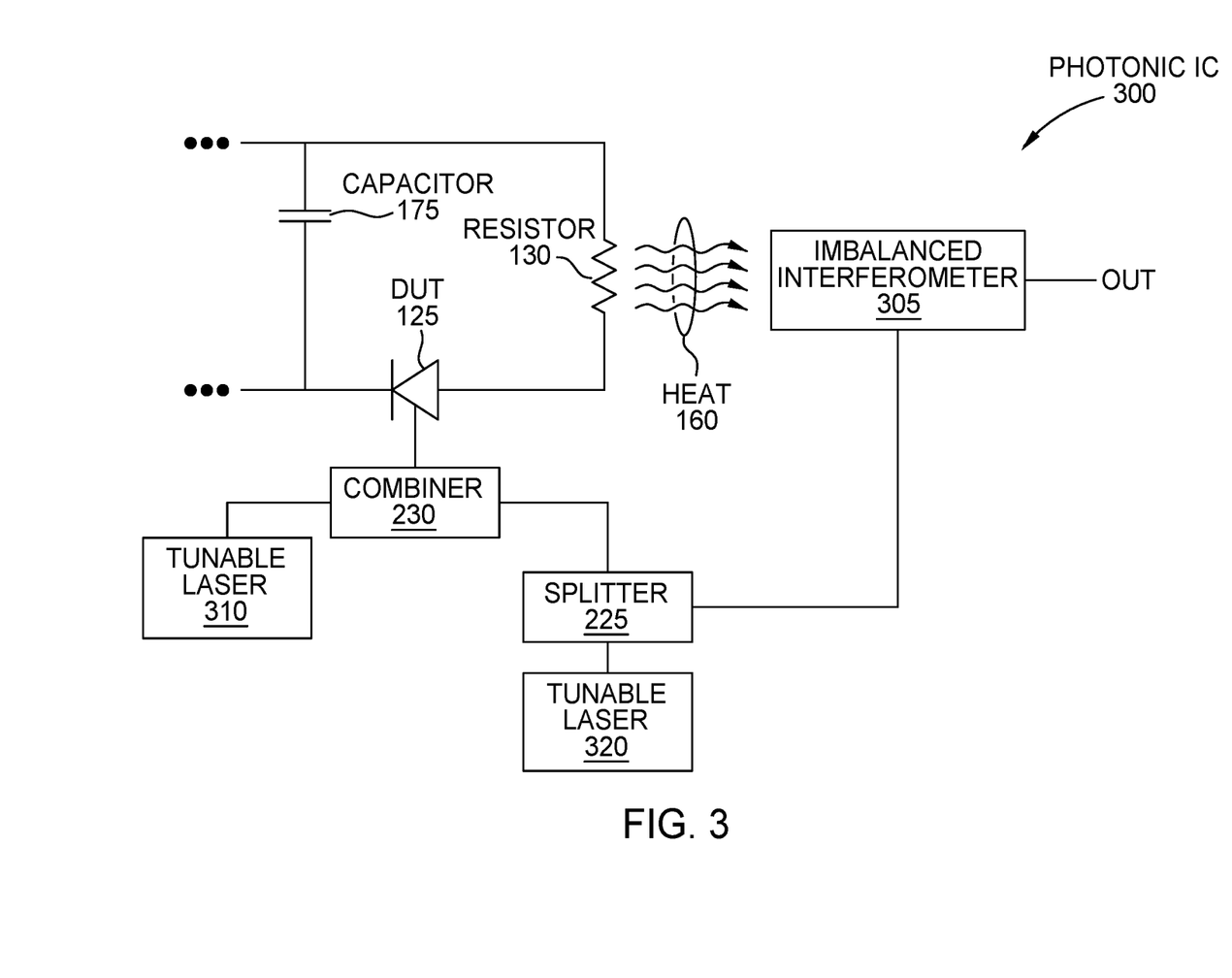
FIG. 3 illustrates testing a bandwidth of a PD in a PIC using an imbalanced interferometer, according to one embodiment described herein.

FIG. 3 illustrates testing a bandwidth of a photodiode in a photonic integrated circuit using an imbalanced interferometer, according to one embodiment described herein. For simplicity, the PIC 300 illustrates only the PD DUT 125 and the capacitor 175 but is assumed to include the other circuitry illustrated in FIG. 2 (e.g., the biasing PDs). The PD DUT 125 receives a heterodyne optical signal from combining light from tunable lasers 310 and 320, which is used to test the bandwidth of the device. As described above, the electrical signal generated by the PD DUT 125 passes through the resistor which generates the heat 160.

Instead of having a balanced interferometer, the PIC 300 includes an imbalanced interferometer 305, which has waveguide arms with different lengths (not shown). That is, the imbalanced interferometer 305 receives an optical signal from a tunable laser 320 which is then split and passes through two arms in the interferometer 305.

In this embodiment, the input optical signal is tunable by the tunable laser 320, unlike in FIG. 2 where the input of the balanced interferometer may be a CW laser that does not change wavelength. As the wavelength of the input optical signal is changed by the tunable laser 320, the response of the interferometer 305 is measured by the detector. As the heat 160 selectively affects one of the arms in the imbalanced interferometer 305, this causes a shift in the output signal. Using the imbalanced interferometer 305 may result in a more accurate temperature reading of the resistor, and thus, a more accurate bandwidth measurement of the PD DUT 125.

In one embodiment, the tunable laser 320 changes the wavelength of the optical signal input into the imbalanced interferometer 305 in parallel with the tunable laser 310 changing the wavelength of the optical signal combined with the optical signal from tunable laser 320 that is transmitted to the PD DUT 125. In one embodiment, the wavelengths are changed in lockstep so that the wavelength difference between the two optical signals remains the same.

By using two tunable lasers, a 2D scan can be performed in the same wave space. The combined data may provide the system with a more robust characterization of the bandwidth of the PD DUT 125 since the system can be calibrated to remove or mitigate the internal uncertainty associated with the interferometer.

Figure 4:
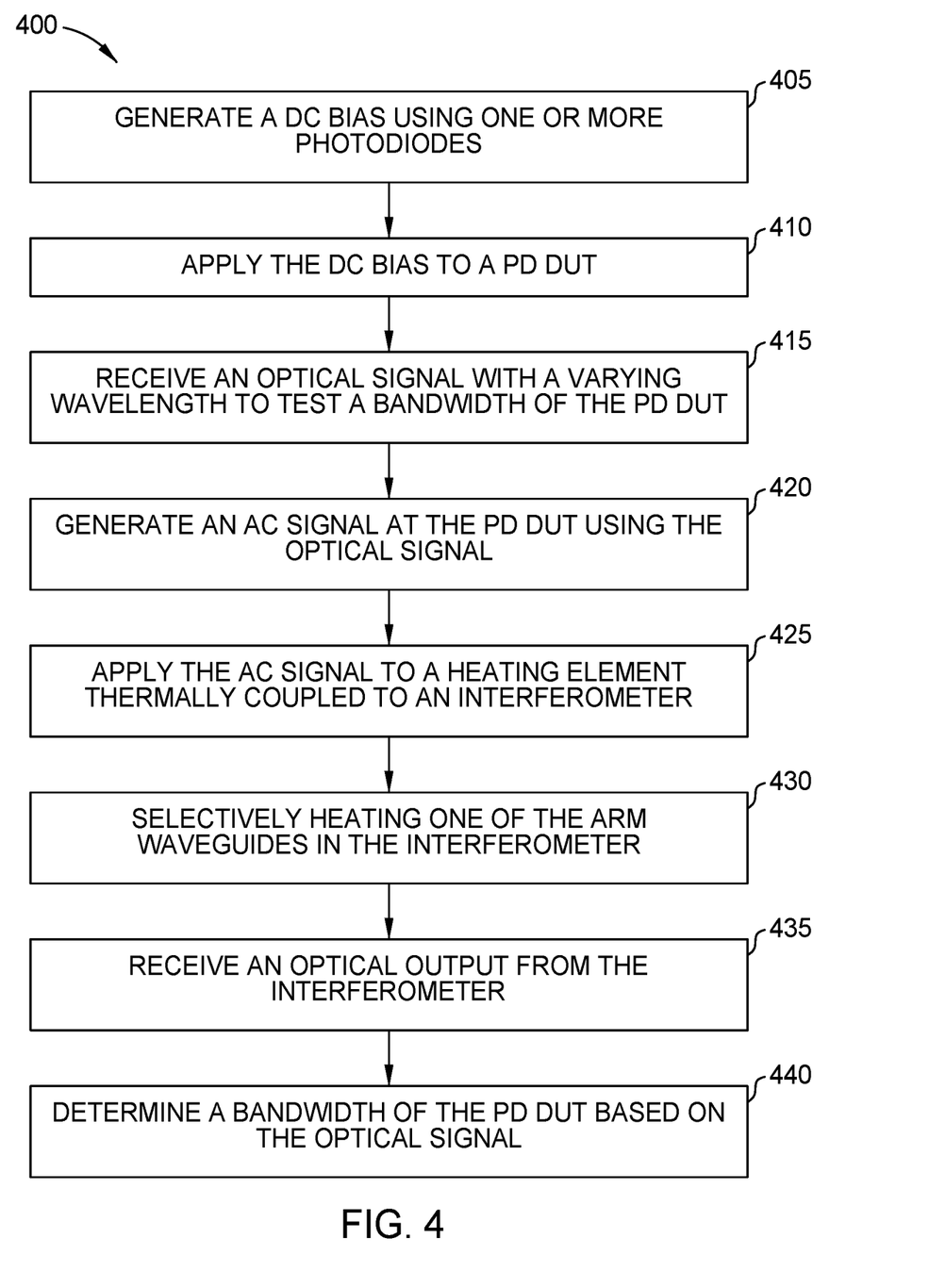
FIG. 4 is a flowchart for testing the bandwidth of a PD, according to one embodiment.

FIG. 4 is a flowchart of a method 400 for testing the bandwidth of a photodiode, according to one embodiment. The method 400 may be used to operate any of the PIC embodiments described above.

At block 405, one or more lasers to generate a DC bias using one or more PDs. If multiple PDs are used to generate the DC bias (e.g., a plurality of PDs coupled in series or daisy chained), a single laser can be split into multiple optical signals which are then received by the PDs to generate the DC bias. Alternatively, respective lasers can be used to power each of the PDs.

While the embodiments herein discuss using PDs to generate the DC bias, in another embodiments, the PIC can include electrical pads to which probes can contact in order to generate a DC bias. However, as discussed above, using optical signals and photodiodes to generate the DC bias may be advantageous relative to using electrical probes since it is avoids the increased cost and complexity that results from having both electrical and optical connectivity in the testing system.

At block 410, the PIC applies the DC bias to the PD DUT. That is, the DC bias creates a DC voltage across the PD DUT.

At block 415, At block 415, the PIC receives an amplitude-modulated optical signal with a varying carrier frequency to test a bandwidth of the PD DUT. In one embodiment, optical heterodyning is used to generate the laser signal. For example, two laser sources which output optical signals at different wavelengths can be combined to generate the optical signal. One (or more) of the laser sources can be tunable so that the wavelength difference between the two optical signals can change, thereby changing the wavelength of the combined optical signal. In this manner, the wavelength of the optical signal received by the PIC can change to test the bandwidth of the PD DUT.

Optical heterodyning is just one technique that can be used to generate an optical signal whose wavelength can vary to test the bandwidth of the PD. In another embodiment, a single amplitude-modulated laser source could be used to generate a varying optical signal for testing the PD.

At block 420, the optical signal generates an AC signal on the PD DUT. In some embodiments, the PD DUT may be exposed on a surface of the PIC so that the optical source can strike the PD DUT directly. However, in another embodiment, the PIC may use one or more waveguides to direct the optical signal through the PIC until it reaches the PD DUT.

At block 425, the PIC includes an electrical circuit that applies the AC signal to a heating element thermally coupled to an interferometer. In one embodiment, the electrical circuit can include the DC biasing PDs used at block 405 to generate the DC bias. A capacitor can be used as shown in FIGS. 2 and 3 so that the AC signal bypasses the DC biasing photodiodes.

In one embodiment, the heating element is a resistor through which the AC signal passes. If the received optical signal is within the bandwidth of the PD DUT, the resulting AC signal has a higher amplitude which results in the heating element producing additional heat. Notably, a DC current (due to the DC bias) may also pass through the heating element which causes it to generate heat. The AC signal generated by the PD DUT can then cause the heat to stay substantially uniform when the carrier frequency of the received optical signal is within the bandwidth of the PD DUT and then decrease to the baseline (resulting from only the DC current) when the carrier frequency of the received optical signal is outside the bandwidth of the PD DUT.

At block 430, the heat from the heating element selectively heats one of the arm waveguides in the interferometer. That is, the heat emitted by the heating elements heats one of the arms in the interferometer more than the other.

The interferometer can be a balanced interferometer or an imbalanced interferometer. In one embodiment, if a balanced interferometer is used, an input optical signal provided to the interferometer may be a CW optical signal that does not have a wavelength that changes. However, if an imbalanced interferometer is used, the input optical signal may be a tunable optical signal. In one embodiment, the interferometer is a MZI.

At block 435, a detector receives an optical output from the interferometer. In one embodiment, the interferometer splits the input optical signal and transmits the respective optical signals in the two arms. The interferometer then combines these signals to generate the optical output.

At block 440, the PD bandwidth calculator determines a bandwidth of the PD DUT using an output generated by the detector. For example, the detector may be a PD and an analog-to-digital converter that converts the optical output of the interferometer into a digitized electrical signal. Using any of the techniques discussed above, the PD bandwidth calculator can evaluate this signal to determine the bandwidth of the PD DUT.

In the current disclosure, reference is made to various embodiments. However, the scope of the present disclosure is not limited to specific described embodiments. Instead, any combination of the described features and elements, whether related to different embodiments or not, is contemplated to implement and practice contemplated embodiments. Additionally, when elements of the embodiments are described in the form of "at least one of A and B," or "at least one of A or B," it will be understood that embodiments including element A exclusively, including element B exclusively, and including element A and B are each contemplated. Furthermore, although some embodiments disclosed herein may achieve advantages over other possible solutions or over the prior art, whether or not a particular advantage is achieved by a given embodiment is not limiting of the scope of the present disclosure. Thus, the aspects, features, embodiments and advantages disclosed herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

As will be appreciated by one skilled in the art, the embodiments disclosed herein may be embodied as a system, method or computer program product. Accordingly, embodiments may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, embodiments may take the form of a computer program product embodied in one or more computer readable medium(s) having computer readable program code embodied thereon.

Program code embodied on a computer readable medium may be transmitted using any appropriate medium, including but not limited to wireless, wireline, optical fiber cable, RF, etc., or any suitable combination of the foregoing.

Computer program code for carrying out operations for embodiments of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described herein with reference to flowchart illustrations and/or block diagrams of methods, apparatuses (systems), and computer program products according to embodiments presented in this disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the block(s) of the flowchart illustrations and/or block diagrams.

These computer program instructions may also be stored in a computer readable medium that can direct a computer, other programmable data processing apparatus, or other device to function in a particular manner, such that the instructions stored in the computer readable medium produce an article of manufacture including instructions which implement the function/act specified in the block(s) of the flowchart illustrations and/or block diagrams.

The computer program instructions may also be loaded onto a computer, other programmable data processing apparatus, or other device to cause a series of operational steps to be performed on the computer, other programmable apparatus or other device to produce a computer implemented process such that the instructions which execute on the computer, other programmable data processing apparatus, or other device provide processes for implementing the functions/acts specified in the block(s) of the flowchart illustrations and/or block diagrams.

The flowchart illustrations and block diagrams in the Figures illustrate the architecture, functionality, and operation of possible implementations of systems, methods, and computer program products according to various embodiments. In this regard, each block in the flowchart illustrations or block diagrams may represent a module, segment, or portion of code, which comprises one or more executable instructions for implementing the specified logical function(s). It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts, or combinations of special purpose hardware and computer instructions.

In view of the foregoing, the scope of the present disclosure is determined by the claims that follow.

We claim:

1. A photonic chip, comprising:
a first optical interface for receiving a first optical signal;
a first photodiode (PD) configured to generate a DC bias using the first optical signal;
a second PD that is biased by the DC bias generated by the first photodiode;
a second optical interface configured to receive a tunable optical signal for testing a bandwidth of the second PD, wherein the second PD generates a varying AC signal based on the tunable optical signal;
a resistor, wherein the varying AC signal heats the resistor;
an interferometer thermally coupled to the resistor;
a third optical interface for receiving a third optical signal that passes through the interferometer; and
a fourth optical interface coupled to an output of the interferometer, wherein an optical output of the interferometer changes in response to heat generated by the resistor.

2. The photonic chip of claim 1, wherein the interferometer comprises a splitter coupled to a combiner using two waveguides, wherein the heat generated by the resistor changes a temperature of one of the waveguides more than the other.

3. The photonic chip of claim 2, wherein the interferometer is a balanced interferometer.

4. The photonic chip of claim 2, wherein the interferometer is an imbalanced interferometer.

5. The photonic chip of claim 1, further comprising:
a plurality of biasing PDs that includes the first PD, wherein the plurality of biasing PDs are coupled in series; and
a splitter configured to split the first optical signal into a plurality of optical signals which are received at the plurality of biasing PDs to generate the DC bias.

6. The photonic chip of claim 5, further comprising:
a capacitor coupled at a first node between the second PD and the plurality of biasing PDs, wherein the capacitor provides an electrical path for the varying AC signal to bypass the plurality of biasing PDs.

7. The photonic chip of claim 1, wherein the tunable optical signal is formed by combining two optical signals at different frequencies, wherein at least one of the two optical signals is tunable so that a frequency difference between the two optical signals is adjustable in order to test the bandwidth of the second PD.

8. A photonic chip, comprising:
a first PD configured to be biased by a DC bias generated by a DC biasing element;
a first optical interface for receiving a combined optical signal formed by combining two optical signals at different frequencies, wherein the first PD generates an AC signal using the combined optical signal;
a heating element, wherein the AC signal causes the heating element to emit heat;
an interferometer thermally coupled to the heating element;
a second optical interface for receiving a first optical signal that passes through the interferometer; and
a third optical interface coupled to an output of the interferometer, wherein an output of the interferometer changes in response to the heat generated by the heating element.

9. The photonic chip of claim 8, wherein the interferometer comprises a splitter coupled to a combiner using two waveguides, wherein the heat generated by the heating element changes a temperature of one of the waveguides more than the other.

10. The photonic chip of claim 9, wherein the interferometer is a balanced interferometer.

11. The photonic chip of claim 9, wherein the interferometer is an imbalanced interferometer.

12. The photonic chip of claim 8, further comprising:
a fourth optical interface for receiving a second optical signal,
wherein the DC biasing element is a second PD in the photonic chip that is configured to generate the DC bias using the second optical signal.

13. The photonic chip of claim 12, wherein the DC biasing element comprises a plurality of biasing PDs that includes the second PD, wherein the plurality of biasing PDs are coupled in series, the photonic chip further comprising:
a splitter configured to split the second optical signal into a plurality of optical signals received at the plurality of biasing PDs to generate the DC bias.

14. The photonic chip of claim 13, further comprising:
a capacitor coupled at a first node between the first PD and the plurality of biasing PDs, wherein the capacitor provides an electrical path for the AC signal to bypass the plurality of biasing PDs.

15. A method, comprising:
applying a DC bias to a first PD in a photonic chip;
receiving a first amplitude-modulated optical signal with a varying carrier frequency to test a bandwidth of the first PD;
generating, using the first PD, an AC signal based on the first optical signal;
applying the AC signal to a heating element thermally coupled to an interferometer in the photonic chip; and
determining the bandwidth of the first PD based on an optical output of the interferometer.

16. The method of claim 15, further comprising:
before determining the bandwidth of the first PD, transmitting the optical output of the interferometer to a detector that is external to the photonic chip.

17. The method of claim 15, further comprising:
receiving a second optical signal at the photonic chip; and
generating the DC bias using a second PD and the second optical signal.

18. The method of claim 17, further comprising:
splitting the second optical signal using an optical splitter in the photonic chip, wherein a first split portion of the second optical signal is directed to the second PD and a second split portion of the second optical signal is directed to a third PD,
wherein the second and third PDs are coupled in series to generate the DC bias.

19. The method of claim 18, wherein a capacitor is coupled at a first node between the second and third PDs and the first PD, wherein the capacitor provides an electrical path for the AC signal to bypass the second and third PDs.

20. The method of claim 15, further comprising:
receiving a second optical signal at the photonic chip;
splitting the second optical signal into a first portion and a second portion using an optical splitter in the interferometer, wherein the first portion is directed into a first arm of the interferometer and the second portion is directed into a second arm of the interferometer; and
selectively heating one of the first or second arms in the interferometer more than the other arm using heat generated by the heating element.

* * * * *